United States Patent
Guedon

(10) Patent No.: US 7,046,040 B2
(45) Date of Patent: May 16, 2006

(54) BOOTSTRAP DRIVER

(75) Inventor: Yannick Guedon, Sassenage (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/902,502

(22) Filed: Jul. 29, 2004

(65) Prior Publication Data

US 2005/0110556 A1 May 26, 2005

(30) Foreign Application Priority Data

Jul. 31, 2003 (FR) ................................. 03 09444

(51) Int. Cl.
  *H03K 19/0175* (2006.01)
  *H03K 19/094* (2006.01)
  *H03K 19/082* (2006.01)

(52) U.S. Cl. .......................................... 326/88; 326/92
(58) Field of Classification Search ................. 326/88, 326/92

See application file for complete search history.

(56) References Cited

U.S. PATENT DOCUMENTS

| 5,747,943 | A | * | 5/1998 | Houk et al. ................. 315/225 |
| 5,801,557 | A | * | 9/1998 | Dubhashi et al. ........... 327/108 |
| 6,215,329 | B1 | * | 4/2001 | Campardo et al. ........... 326/88 |

FOREIGN PATENT DOCUMENTS

| EP | 0 367 006 A2 | 5/1990 |
| EP | 0 887 933 A1 | 12/1998 |

* cited by examiner

*Primary Examiner*—Don Le
*Assistant Examiner*—Jason Crawford
(74) *Attorney, Agent, or Firm*—Lisa K. Jorgenson; Robert Iannucci; Seed IP Law Group PLLC

(57) ABSTRACT

A bootstrap driver comprises an output stage having an N-type high-side transistor and a low-side transistor, also of the N-type, which are arranged in series between a positive supply terminal and a negative supply terminal. A control circuit of the high-side transistor and a control circuit of the low-side transistor are respectively supplied by a first voltage regulator and a second voltage regulator, which are mutually independent. A recovery diode is connected by its anode to the output of the first voltage regulator and by its cathode to the positive supply terminal, in order to conduct the reverse current of a bootstrap diode when the output of the circuit switches from a low state to a high state.

23 Claims, 4 Drawing Sheets

BOOTSTRAP DRIVER

BACKGROUND OF THE INVENTION

1. Field of the Invention

The present invention relates to a bootstrap driver, comprising a power output stage for supplying a load in a full-bridge or half-bridge configuration.

2. Description of the Related Art

It is used, in particular, in the field of class-D vertical deflection amplifiers involving BCD (bipolar/CMOS/DMOS) technology, which are intended for screens such as CRTs (cathode-ray tubes), computer monitors or television screens, as well as in full-bridge or half-bridge bootstrap systems.

The diagram in FIG. 1 illustrates the working principle of an example of a power output stage, which is suitable for a half-bridge supply.

This output stage 30 comprises a high-side transistor MHS and a low-side transistor MLS, which are arranged in series between a positive supply terminal 1, to which a positive potential +Vcc is applied, and a negative supply terminal 2, to which a negative potential −Vcc is applied. In BCD technology, the transistors MHS and MLS are for example VDMOS (vertical double-diffused metal-oxide semiconductor) or LDMOS (lateral double-diffused metal-oxide semiconductor) transistors. The voltages referred to below are expressed in relation to the potential −Vcc.

For reasons of current compatibility, the transistors MHS and MLS are generally both N-type transistors, for example NPN bipolar transistors, or N-type MOS transistors (NMOS transistors) as in the example which is represented. In this case, the source of the transistor MHS and the drain of the transistor MLS are connected together, this common node between them forming an output node OUT of the drive circuit, which delivers an output voltage Vout. The drain of the transistor MHS is connected to the terminal 1 and the source of the transistor MLS is connected to the terminal 2.

The output OUT switches between a low state and a high state, corresponding respectively to potentials −Vcc and +Vcc at this node. In order to switch in this way, the potential at the control gate of transistor MHS must become about 10 V higher than the potential at its source ($V_{GS} \approx 10V$) when the output OUT changes from the low state to the high state. It therefore needs to become higher than the potential +Vcc. It is conventional to use the bootstrapping technique for this.

The principle of this technique will be explained below with reference to the diagram in FIG. 2, which illustrates an example of a bootstrap driver.

In addition to the output stage 30 with the transistors MHS and MLS, which are NMOS transistors in this case, the driver comprises a voltage regulator 3 arranged between the terminal 2 and a regulated-voltage node A. The regulator 3 delivers a regulated voltage Vreg from which control voltages are obtained, these being applied to the control gates of the transistors MHS and MLS. For this purpose, the driver also comprises a high-side control circuit HSD (standing for "high-side driver") for controlling the transistor MHS, and low-side control circuit LSD (standing for "low-side driver") for controlling the transistor MLS. These circuits are inverting stages in the example which is represented.

The circuit LSD is supplied between the voltages −Vcc and Vreg, and receives a control signal X. The circuit HSD is supplied between the voltages Vout and Vboot, where the Vout is the voltage at the output terminal OUT and Vboot is a voltage corresponding substantially to the voltage Vout boosted by the voltage Vreg, and it receives a control signal $\bar{X}$ which is the logical inverse of the signal X. The voltage Vreg is available at the node A. The voltage Vboot is available at the boost-voltage node B. In order to generate the voltage Vboot, the driver also comprises a bootstrap diode Dboot, which is connected by its anode to the node A and by its cathode to the node B, as well as a so-called bootstrap capacitance Cboot connected between the node B and the output node OUT.

The bootstrap driver operates in the following way. When the transistor MLS is on (X=0), that is to say when the output node OUT is in the low state (potential −Vcc), the capacitance Cboot becomes charged to a voltage V such that V=Vreg−Vd, where Vd denotes the forward voltage drop of the diode Dboot. When the transistor MHS is turned on ($\bar{X}$=0), the diode Dboot conducts some of the current necessary for charging the gate of the transistor MHS while the output node OUT is still at the potential −Vcc, the rest of this current being obtained later by discharging the capacitance Cboot. The diode Dboot then stores charges. The charge Q accumulated in this way by the diode Dboot is such that Q= $\bar{I} \times \tau$, where $\bar{I}$ denotes the aforementioned part of the current and where τ denotes the recovery time of the diode Dboot. For example, if $\bar{I}$=100 mA and τ=50 ns, then Q=5 nC. In order to turn the diode Dboot off within a specific time $t_B$, when the voltage Vout is increasing towards +Vcc so that the voltage Vout at the output node OUT exhibits a variation $$\frac{dVout}{dt},$$

it is therefore necessary for the diode to conduct a reverse current $\bar{I}_{rev}$ such that $$\bar{I}_{rev} = \bar{I} \times \frac{\tau}{t_B}.$$

The reverse current $\bar{I}_{rev}$ then flows via the anode of the diode Dboot to the node A. An overvoltage will then be produced at the node A if no low-impedance path is available to the reverse current $\bar{I}_{rev}$, especially if the regulator cannot absorb this current.

One drawback is that this overvoltage risks damaging or destroying the regulator 3 as well as the control circuit LSD. This situation is exacerbated when the regulated-voltage Vreg delivered by the regulator 3 is also the supply voltage for logic circuits of the system. This is because the node A is then connected to the supply inputs of these logic circuits, so that the overvoltage which occurs at the node also risks damaging or destroying them.

In order to overcome this drawback, a capacitance may be provided for decoupling this regulator 3, so as to provide a low-impedance path leading to the negative supply terminal 2. In view of the current values involved, however, this decoupling capacitance needs to have a relatively high value (substantially equal to 100 nF). Returning to the example given above, the overvoltage across the terminals of a 100 nF decoupling capacitance is only $$\frac{5 \text{ nC}}{100 \text{ nF}} = 50 \text{ mV}.$$

Such a capacitance nevertheless has to be produced in the form of an external capacitance, which is detrimental in certain applications.

It is also conceivable to provide a switch controlled by suitable logic, in order to short-circuit the regulator at the moment when the voltage variation $$\frac{dVout}{dt}$$

appears at the output OUT, and when the overvoltage consequently risks being produced. This logic must arrange for the switch not to trigger too early or too late in relation to the start of the voltage variation $$\frac{dVout}{dt}.$$

Such logic is consequently quite difficult to produce.

BRIEF SUMMARY OF THE INVENTION

One embodiment of the invention provides a bootstrap driver which overcomes the aforementioned drawbacks.

To this end, the bootstrap driver includes:
- an output stage having an N-type high-side transistor and an N-type low-side transistor, which are arranged in series between a positive supply terminal and a negative supply terminal, an output of the driver being tapped from the common node between these transistors;
- a first control circuit for controlling the high-side transistor and a second control circuit for controlling the low-side transistor;
- a first voltage regulator having an output delivering a supply voltage for the first control circuit, and a second voltage regulator having an output delivering a supply voltage for the second control circuit, the first and second voltage regulators being mutually independent;
- a bootstrap capacitance arranged between the output of the driver and a boost-voltage node;
- a bootstrap diode, which is connected by its anode to the output of the first voltage regulator and by its cathode to the boost-voltage node; and
- a recovery diode connected by its anode to output of the first voltage regulator and by its cathode to the positive supply terminal, in order to conduct the reverse current of the bootstrap diode when the output of the driver switches from a low state, in which the low-side transistor is on and the high-side transistor is off, to a high state in which the low-side transistor is off and the high-side transistor is on.

Stated otherwise, the driver resolves the problem in question by using two independent regulators, one generating the voltage Vreg for supplying the control circuit LSD and optionally logic circuits of the system, and the other generating a boosted voltage specifically for supplying the high-side control circuit HSD, this regulator being protected against the overvoltage by the recovery diode, which returns the reverse current of the bootstrap diode to the positive supply terminal when the output voltage rises to +Vcc. Advantageously, this solution does not require any control logic. Furthermore, the energy stored in the bootstrap diode Dboot is recovered since it is returned to the positive supply terminal via the protective diode. This is particularly advantageous in applications where the system is supplied by a battery.

BRIEF DESCRIPTION OF THE SEVERAL VIEWS OF THE DRAWINGS

Other characteristics and advantages of the invention will become clearer on reading the following description. This description is purely illustrative and should be read in conjunction with the appended drawings, in which the same elements bear the same references throughout the figures.

DETAILED DESCRIPTION OF THE INVENTION

Figure 1:
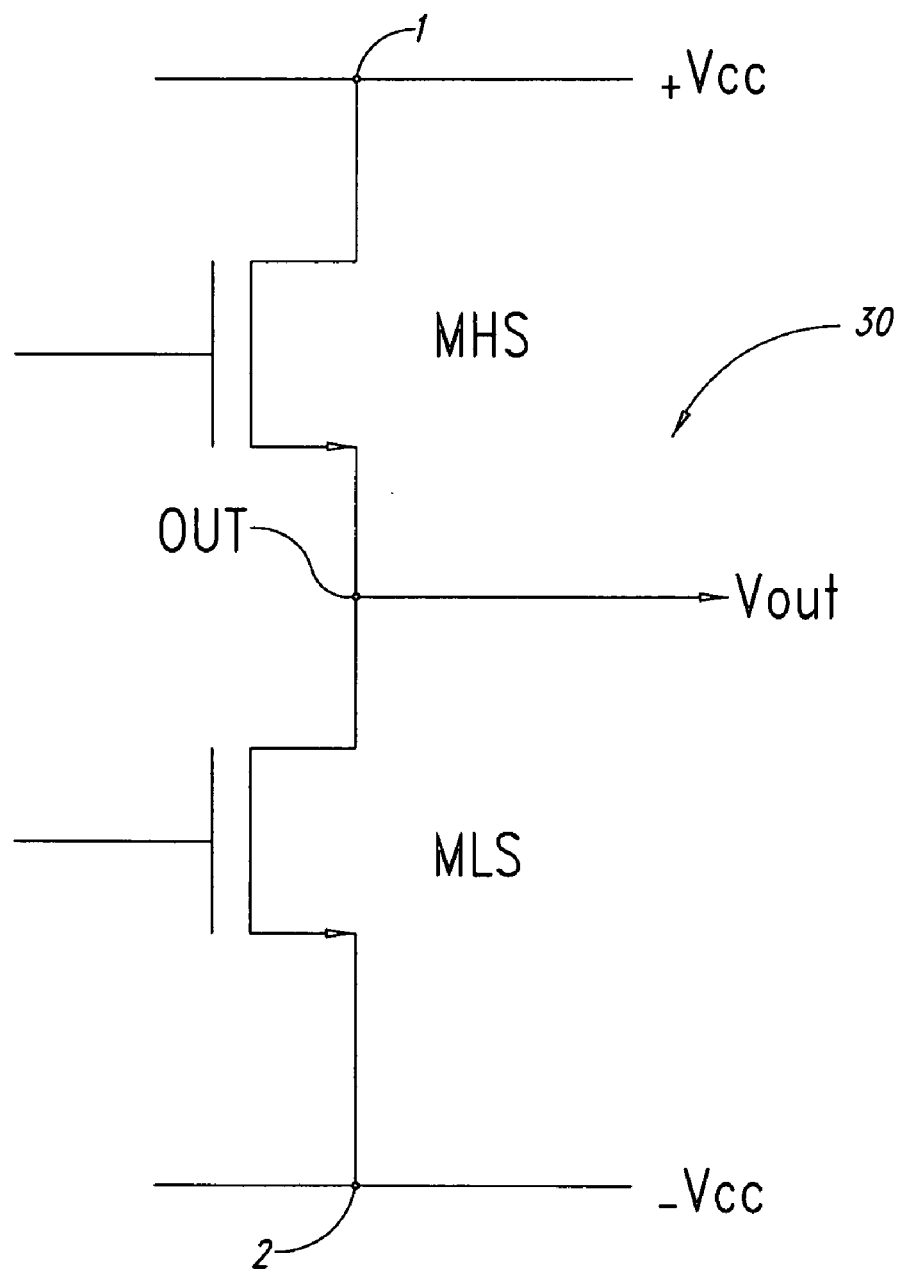
FIG. 1 is a diagram of a power output stage with NMOS transistors.
Figure 2:
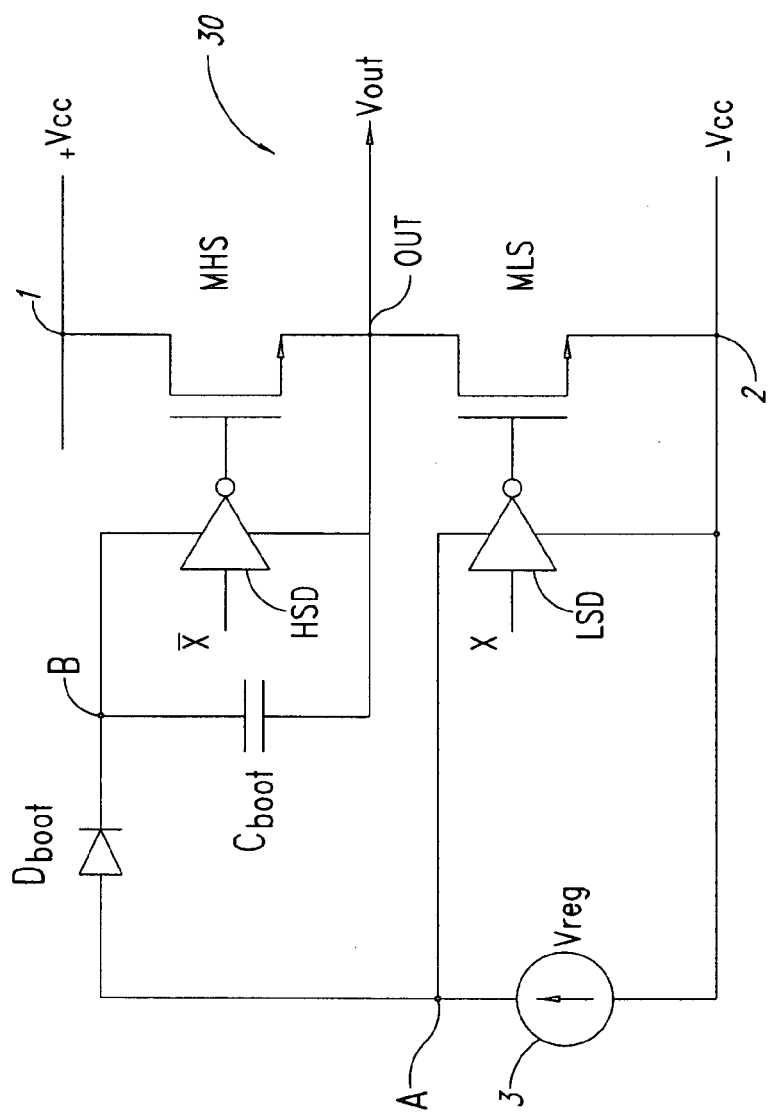
FIG. 2 is a diagram of an example of a bootstrap driver illustrating the principle of the bootstrap technique.
Figure 3:
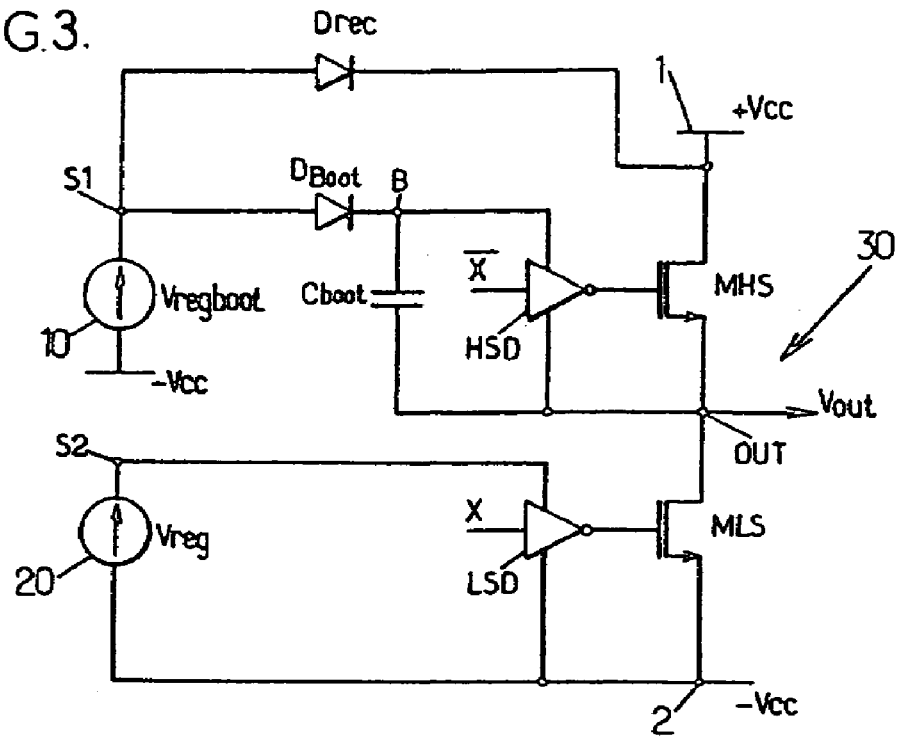
FIG. 3 is a diagram of an example of a bootstrap driver according to one embodiment of the invention.

FIG. 3 shows an exemplary embodiment of a bootstrap driver according to the invention. The driver comprises an output stage 30, for example similar to one described in the introduction with reference to the diagram in FIG. 1. This stage has an N-type high-side transistor MHS and a low-side transistor MLS, also of the N-type, which are arranged in series with one another between the positive supply terminal 1 and the negative supply terminal 2. For example, the potential −Vcc is equal to −18 V and the potential +Vcc is equal to +18 V. The output OUT of the circuit is tapped from the common node between these transistors MHS and MLS, and delivers the output signal Vout. This output stage is suitable for supplying a load in a half-bridge configuration, that is one such that the load is connected between the output OUT and a terminal delivering a potential intermediate between the potentials −Vcc and +Vcc, for example a reference-earth potential. Of course, the invention is not limited to a half-bridge supply, but can easily be generalized to a full-bridge supply in which the load is connected in floating mode between the respective outputs of two stages similar to the stage 30.

The driver also comprises a control circuit HSD for controlling the transistor MHS and a control circuit LSD for controlling the transistor MLS. According to one embodiment of the invention, the respective supplies of these two control circuits are independent.

This is because the driver contains one voltage regulator 10 having an output which delivers a voltage Vregboot for supplying the control circuit HSD, and another voltage regulator 20 having an output which delivers a voltage Vreg for supplying the control circuit LSD. These regulators 10 and 20 are mutually independent, that is to say there is no coupling between them. The regulator 10 is connected between the negative supply terminal 2 and a terminal S1. The regulator 20 is connected between the negative supply terminal 2 and a terminal S2. The control circuit HSD is supplied between the output terminal OUT and the node B, and the control circuit LSD is supplied between the terminals 2 and S2.

According to the bootstrap principle, the drive circuit also comprises a bootstrap capacitance Cboot arranged between the output OUT of the circuit and the boost-voltage node B, as well as a bootstrap diode Dboot connected by its anode to the output S1 of the voltage regulator 10 and by its cathode to the node B. The capacitance Cboot and the diode Dboot form bootstrap means.

The driver also comprises a recovery diode Drec connected by its anode to the output of the overvoltage regulator 10 and by its cathode to the positive supply terminal 1. The function of this recovery diode Drec is to conduct the reverse current of the diode Dboot when the output OUT of the drive circuit switches from the low state, in which the transistor MLS is on and the transistor MHS is off, to the high state in which the transistor MLS is off and the transistor MHS is on.

Advantageously, the diode Drec turns itself on automatically, that is without the intervention of any control logic. Furthermore, the reverse current of the diode Dboot is not lost but is re-injected to the positive supply terminal 1. This energy recovery is particularly beneficial for applications of the invention to battery-operated systems.

One advantage is due to the fact that the control circuit HSD is supplied by the regulator 10, which is separate from and independent of the regulator 20 used for supplying the control circuit LSD. Specifically, this allows the circuits supplied by the regulator 20, which include the control circuit LSD and optionally logic circuits (not shown) of the system, to be protected against the overvoltage which is produced at the anode of the bootstrap diode Dboot when the output OUT switches to the high state.

An exemplary embodiment of the regulators 10 and 20 will now be described with reference to the diagram in FIG. 4.

The regulator 20 comprises two branches in parallel between the positive and negative supply terminals, 1 and 2 respectively.

A first branch comprises a Zener diode DZ2, for example a 12 V Zener diode, which is connected to the terminal 2 by its anode and to the terminal 1 by its cathode via a leakage resistor Rc2, for example a 150 kΩ resistor. The function of this branch is to generate a regulated voltage, which is equal to 12 V in the example.

A second branch, forming the output stage of the regulator 20, comprises an output transistor M2 in series with a resistor Rp2. This output stage is a follower, the function of which is to draw the large current necessary for supplying the control circuit LSD. The transistor M2 may be a MOS transistor, in particular an NMOS, for example an LDMOS which has the advantage of withstanding high voltages. The control gate of M2 is connected to the cathode of the Zener diode DZ2. The output of the regulator 20, which delivers the regulated voltage Vreg, is tapped from the source of the resistor M2, which is connected to the terminal 2 through the resistor Rp2, the drain of M2 being connected to the terminal 1.

In one example, the regulator 10 has basically the same structure as the regulator 20. The description of this structure is not repeated here. It will merely be pointed out that the components M2, Rp2, DZ2 and Rc2 of the regulator 20 are replaced by respectively identical components in the regulator 10, which are respectively denoted by the references M1, Rp1, DZ1 and Rc1. It shall be noted that there is no coupling between the components forming the regulator 10 and those forming the regulator 20. It is in this meaning that the regulators 10 and 20 are referred to as being independent.

The leakage resistor Rp1 makes it possible to set the output voltage Vregboot of the regulator 10 correctly when the latter is not under load.

Of course, the regulators 10 and 20 may have differing structures, and the example given above does not imply any limitation. Further, a structure which is complementary to the one given as an example above may also be envisaged for one and/or other of the regulators 10 and 20, in which the transistors M1 and M2 are P-type MOS (PMOS) transistors, especially in the scope of auto-stepdown circuits. It is also possible to use bipolar transistors, either NPN or PNP, in order to produce one and/or other of the regulators 10 and 20. This is why all the characteristics of the invention relating to the regulators 10 and/or 20 which are denoted here with reference to the terminals of a MOS transistor, that is the control gate, the source and the drain, can be applied to bipolar transistors by using the vocabulary associated with this technology in order to denote the corresponding terminals of these transistors, namely the base, the emitter and the collector, respectively.

Figure 4:
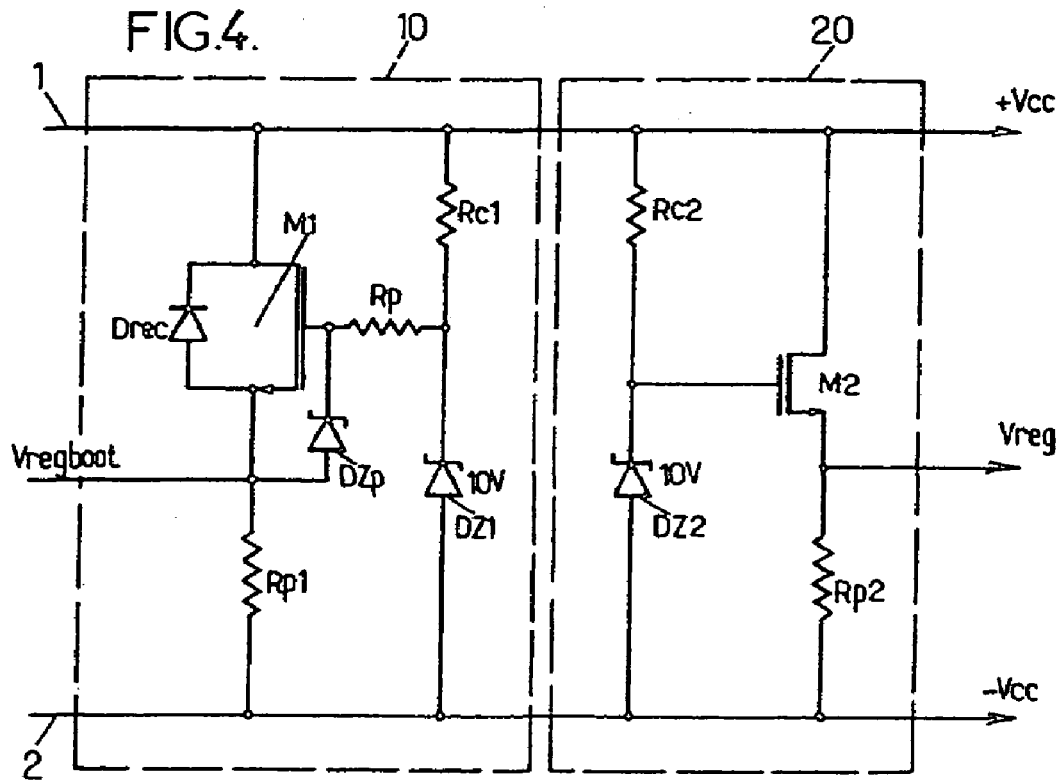
FIG. 4 is a diagram of an exemplary embodiment of two voltage regulators according to the invention.

When the output transistor M1 of the regulator 10 is a MOS transistor, the task of the recovery diode Drec may advantageously be fulfilled by an intrinsic diode contained between the source and the drain of the transistor M1, as represented on the diagram in FIG. 4. In this case, there is no need to provide an additional diode such as the diode represented in FIG. 3.

In an advantageous embodiment, the output transistor M1 of the regulator 10 is furthermore provided with additional protection means, which will now be described.

These additional protection means make it possible to further reduce or eliminate the risk of damaging or destroying the voltage regulator 10, and in particular its output transistor M1.

These means, which can be seen in FIG. 4, comprise a protective diode, for example a Zener diode DZp, coupled by its anode to the source and by its cathode to the control gate of the transistor M1. The purpose of this diode is to allow the potential at the control gate of M1 to follow the potential at its source, in particular when the potential at the source of M1 increases because of the reverse current of the bootstrap diode Dboot. This avoids a reverse gate-source voltage $\overline{V_{GS}}$ greater than the maximum reverse gate-source voltage $\overline{V_{GSmax}}$ of the transistor M1 being reached before the protective diode Drec is turned on. Specifically, the diode Drec does not conduct immediately when the overvoltage occurs, since it is first necessary for the voltage across its terminals to exceed its conduction threshold $V_D$, that is the potential at the source of M1 has to reach $V_D$+VCC. Without the diode DZp there is therefore still a risk, albeit a reduced risk, that the reverse gate-source voltage $\overline{V_{GS}}$ of M1 will exceed the permissible limit. The diode DZp makes it possible to clamp the reverse gate-source voltage $\overline{V_{GS}}$ to $V_D$, where $V_D$ denotes the threshold voltage of the diode DZp, for example 0.7 V. When M1 is a MOS transistor, the choice of a Zener diode for DZp furthermore makes it possible to benefit from protection of the voltage $V_{GS}$, for example at 5 V, in a normal operating mode by virtue of the Zener threshold.

The additional protection means may also comprise a resistor Rp, for example a 10 kΩ resistor, arranged in series with the control gate of the resistor M1 in order to limit the current. This resistor is transparent in the normal operating mode of the regulator (that is when there: is no overvoltage), and has an effect only in the event of an overvoltage at the source of the transistor M1.

Figure 5:
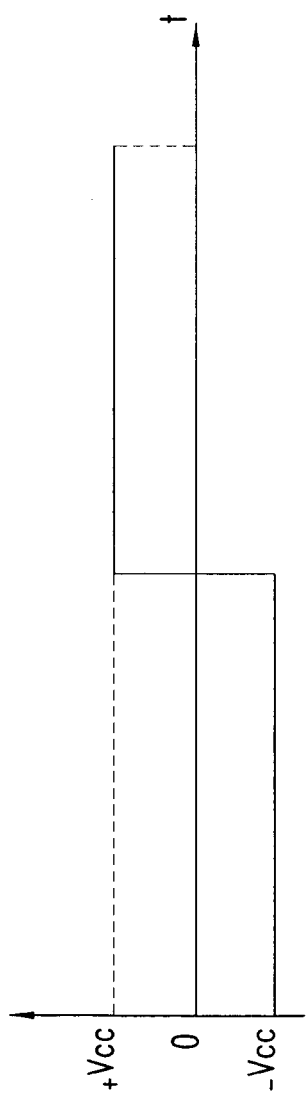
FIG. 5 and FIG. 6 are curves illustrating the way in which the voltage regulator operates in order to generate the boosted voltage according to one embodiment of the invention.
Figure 6:
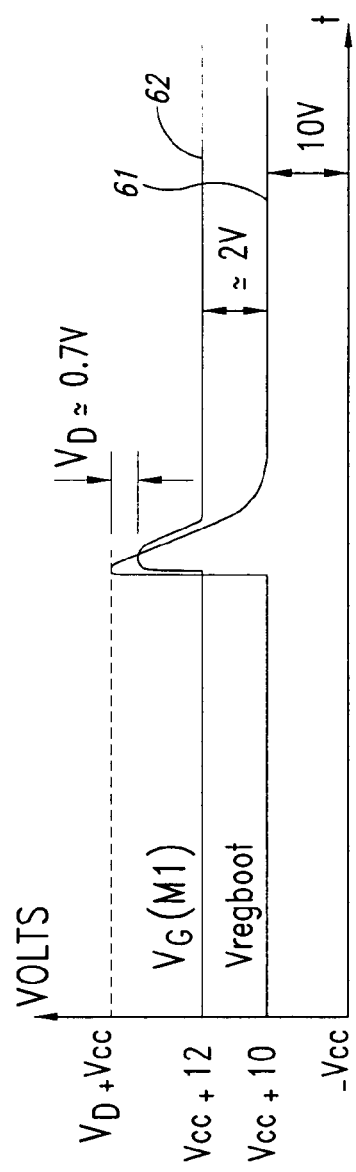

The time diagrams in FIGS. 5 and 6 illustrate the way in which the regulator 10 operates in the embodiment with the additional protection means.

FIG. 5 represents the waveform of the output voltage Vout of the drive circuit during one period. The circuit Vout oscillates between the reference potential −Vcc and the voltage +Vcc.

In FIG. 6, which should be studied in conjunction with FIG. 5, the curve 61 gives the waveform of the voltage Vregboot, and the curve 62 gives the waveform of the gate voltage $V_G$ of the output transistor M1 of the regulator 10.

During normal operation, the voltage Vregboot is substantially equal to 10 V, and the voltage $V_G$ is equal to Vregboot plus the gate-source voltage M1, which is substantially equal to 2 V.

As can be seen, when Vout changes from −Vcc to +Vcc, the voltage Vregboot becomes higher than its normal value because of the overvoltage which is produced at the node S1, that is at the source of the regulator 10 (source of M1). Vregboot nevertheless reaches a maximum equal to $V_D$+VCC, where $V_D$ is the conduction threshold of the recovery diode Drec. Beyond this, the diode Drec starts to conduct so that the voltage Vregboot does not increase any further. The overvoltage is therefore limited.

Further, at the moment when the overvoltage is produced, the protective diode DZp conducts so that the gate voltage $V_G$ of M1 follows the voltage Vregboot, to within the forward voltage drop $V_D$ of the diode DZp. In follows that the reverse gate-source voltage $\overline{V_{GS}}$ of M1 never exceeds this limit $V_D$, which is much less than $\overline{V_{GSmax}}$. This is the case with a transistor M1 for which, for example, $\overline{V_{GSmax}}$ is equal to 10 V.

It shall be noted that the protective diode DZp is in principle transparent during normal operation of the regulator 10, but also serves to limit the voltage $V_{GS}$ of M1 to the Zener voltage, that is to 5 V in the example. This effect provides protection for the transistor M1 in the event of current demands which may be too much for the transistor M1.

French Patent Application No. 0309444, filed Jul. 31, 2003, is incorporated herein by reference, in its entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A bootstrap driver, comprising:
   an output stage having an N-type high-side transistor and an N-type low-side transistor, which are arranged in series between a positive supply terminal and a negative supply terminal, an output of the driver being tapped from a common node between these transistors;
   a first control circuit for controlling the high-side transistor and a second control circuit for controlling the low-side transistor;
   a first voltage regulator having an output delivering a first supply voltage for said first control circuit, and a second voltage regulator having an output delivering a second supply voltage for said second control circuit, said first and second voltage regulators being mutually independent;
   a bootstrap capacitance arranged between the output of the driver and a boost-voltage node;
   a bootstrap diode having an anode connected to the output of the first voltage regulator and a cathode connected to the boost-voltage node; and
   a recovery diode having an anode connected to the output of the first voltage regulator and a cathode connected to the positive supply terminal, in order to conduct a reverse current of the bootstrap diode when the output of the driver switches from a low state, wherein the low-side transistor is on and the high-side transistor is off, to a high state wherein the low-side transistor is off and the high-side transistor is on.

2. The driver according to claim 1 wherein the first voltage regulator has an output transistor with a conduction terminal that constitutes the output of the first voltage regulator, and wherein said first voltage regulator comprises a protective diode for protection against output overvoltages, the protective diode having an anode connected to the conduction terminal of said output transistor and a cathode connected to a control terminal of said output transistor.

3. The driver according to claim 2 wherein the first regulator further comprises a protective resistor connected in series with the control terminal of the output transistor of said first voltage regulator.

4. The driver according to claim 2 wherein the output transistor is a MOS transistor, and wherein the protective diode of the first voltage regulator is a Zener diode with a threshold voltage lower than a maximum forward gate-source voltage of the output transistor of the first voltage regulator.

5. The driver according to claim 2 wherein the output transistor of the first voltage regulator is an LDMOS transistor.

6. The driver according to claim 2 wherein the output transistor of the first voltage regulator is an MOS transistor and the recovery diode is an intrinsic diode of the MOS transistor.

7. The driver according to claim 1 wherein the first and second voltage regulators each include:
   an output transistor having a first conduction terminal coupled to the positive supply terminal, a second conduction terminal from which the output of the voltage regulator is taken, and a control terminal;
   a first resistance coupled between the second conduction terminal and the negative supply terminal;
   a second resistance coupled between the first conduction terminal and the control terminal; and
   a zener diode coupled between the control terminal and the negative supply terminal.

8. A bootstrap driver, comprising:
   an output stage having a high-side transistor and a low-side transistor, arranged in series between a positive supply terminal and a negative supply terminal, an output of the driver being tapped from a common node between these transistors;
   a first control circuit for controlling the high-side transistor and a second control circuit for controlling the low-side transistor;
   a bootstrap capacitance arranged between the output of the driver and a supply input of the first control circuit;
   a bootstrap diode having an anode, and a cathode connected to a supply input of the first control circuit;

a first voltage regulator having an output coupled to the anode of the bootstrap diode and structured to deliver a first supply voltage to the supply input of first control circuit via the bootstrap diode; and a second voltage regulator having an output delivering a second supply voltage to the supply input of the second control circuit.

9. The driver of claim 8 wherein the first voltage regulator has an output transistor with a conduction terminal that constitutes the output of the first voltage regulator, and wherein the first voltage regulator comprises a protective diode for protection against output overvoltages, the protective diode having an anode connected to the conduction terminal of the output transistor and a cathode connected to a control terminal of the output transistor.

10. The driver of claim 9 wherein the first regulator further comprises a protective first resistor having a first terminal connected to the control terminal of the output transistor of the first voltage regulator.

11. The driver of claim 10 wherein the first regulator further comprises:
a second resistor coupled between the positive supply terminal and a second terminal of the first resistor; and
a zener diode coupled between the second terminal of the first resistor and the negative supply terminal.

12. The driver of claim 9 wherein the protective diode of the first voltage regulator is a Zener diode with a threshold voltage lower than a maximum voltage between the control and conduction terminals of the output transistor of the first voltage regulator.

13. The driver of claim 9 wherein the output transistor of the first voltage regulator is an MOS transistor having an intrinsic diode coupled between the positive supply terminal and the output of the first voltage regulator.

14. The driver of claim 8 wherein the first and second voltage regulators each include:
an output transistor having a first conduction terminal coupled to the positive supply terminal, a second conduction terminal from which the output of the voltage regulator is taken, and a control terminal;
a first resistance coupled between the second conduction terminal and the negative supply terminal;
a second resistance coupled between the first conduction terminal and the control terminal; and
a zener diode coupled between the control terminal and the negative supply terminal.

15. The driver of claim 8, further comprising a recovery diode having an anode connected to the output of the first voltage regulator and a cathode connected to the positive supply terminal.

16. A bootstrap driver, comprising:
an output stage having a high-side transistor connected between a positive supply terminal and an output of the driver and a low-side transistor connected between the output of the driver and a negative supply terminal;
a first control circuit for controlling the high-side transistor and a second control circuit for controlling the low-side transistor;

a bootstrap capacitance arranged between the output of the driver and a supply input of the first control circuit;

a bootstrap diode having an anode, and a cathode connected to a supply input of the first control circuit;

a first voltage regulator having an output coupled to the anode of the bootstrap diode and structured to deliver a first supply voltage to the supply input of first control circuit via the bootstrap diode; and a recovery diode having an anode connected to the output of the first voltage regulator and a cathode connected to the positive supply terminal.

17. The driver of claim 16 wherein the first voltage regulator has an output transistor with a conduction terminal that constitutes the output of the first voltage regulator, and wherein the first voltage regulator comprises a protective diode for protection against output overvoltages, the protective diode having an anode connected to the conduction terminal of the output transistor and a cathode connected to a control terminal of the output transistor.

18. The driver of claim 17 wherein the first regulator further comprises a protective first resistor having a first terminal connected to the control terminal of the output transistor of the first voltage regulator.

19. The driver of claim 18 wherein the first regulator further comprises:
a second resistor coupled between the positive supply terminal and a second terminal of the first resistor; and
a zener diode coupled between the second terminal of the first resistor and the negative supply terminal.

20. The driver of claim 17 wherein the protective diode of the first voltage regulator is a Zener diode with a threshold voltage lower than a maximum voltage between the control and conduction terminals of the output transistor of the first voltage regulator.

21. The driver of claim 17 wherein the output transistor of the first voltage regulator is an MOS transistor and the recovery diode is an intrinsic diode of the MOS transistor.

22. The driver of claim 16, further comprising a second voltage regulator coupled between the negative supply terminal and the supply input of the second control circuit.

23. The driver of claim 22 wherein the first and second voltage regulators each include:
an output transistor having a first conduction terminal coupled to the positive supply terminal, a second conduction terminal from which the output of the voltage regulator is taken, and a control terminal;
a first resistance coupled between the second conduction terminal and the negative supply terminal;
a second resistance coupled between the first conduction terminal and the control terminal; and
a zener diode coupled between the control terminal and the negative supply terminal.

* * * * *